United States Patent [19]
Baker et al.

[11] Patent Number: 5,244,839
[45] Date of Patent: Sep. 14, 1993

[54] SEMICONDUCTOR HYBRIDS AND METHOD OF MAKING SAME

[75] Inventors: James C. Baker, Coppell; Emily A. Groves, Sachse; Douglas Paradis, Richardson; Charles P. Monaghan, Garland; Barry Lanier, Allen; Thomas D. Bonifield; Julie S. England, both of Dallas, all of Tex.; Glenn A. Cerny, Avezzano, Italy

[73] Assignee: Texas Instruments Incorporated, Dallas, Tex.

[21] Appl. No.: 717,149

[22] Filed: Jun. 18, 1991

[51] Int. Cl.⁵ .................... H01L 21/60; H01L 21/465
[52] U.S. Cl. .................... 437/205; 437/209; 437/228
[58] Field of Search ............... 437/205, 207, 208, 209, 437/915, 51, 228, 229; 148/DIG. 160, DIG. 80, DIG. 164; 359/264, 265, 267, 268

[56] References Cited

U.S. PATENT DOCUMENTS

| | | | |
|---|---|---|---|
| 4,472,875 | 9/1984 | Christian et al. | 437/208 |
| 4,596,069 | 6/1986 | Bayraktaroglu | 437/51 |
| 4,612,083 | 9/1986 | Yasumoto et al. | 437/208 |
| 4,775,550 | 10/1988 | Chu et al. | 437/231 |
| 5,001,080 | 3/1991 | Wada et al. | 437/51 |

FOREIGN PATENT DOCUMENTS 61-75325  4/1986  Japan ........................... 359/274

Primary Examiner—Olik Chaudhuri
Assistant Examiner—Loc Q. Trinh
Attorney, Agent, or Firm—Rene E. Grossman; Richard L. Donaldson

[57] ABSTRACT

A method of making a hybrid semiconductor device and the device comprising providing a semiconductor substrate having electrical devices therein, providing a first resilient layer of electrically insulating material over the substrate which can be disposed directly onto the substrate with a substantially planar exposed surface, providing a second resilient layer of electrically insulating material over the first resilient layer which can be disposed directly onto the first layer with a substantially planar exposed surface, the second layer having a relatively resilient state and a rigid state, providing resilient standoff from the third resilient layer at spaced locations on the second layer by removing predetermined portions of the third layer, securing a semiconductor superstrate to the semiconductor device, forming electrical devices on the superstrate, and then connecting the electrical devices on the superstrate to the electrical devices on the substrate.

18 Claims, 2 Drawing Sheets

SEMICONDUCTOR HYBRIDS AND METHOD OF MAKING SAME

BACKGROUND OF THE INVENTION

1. Field of the Invention

This invention relates to semiconductor hybrid devices and methods of making same and primarily to such hybrid devices and methods of fabrication as applied to focal plane array circuits.

2. Brief Description of the Prior Art

Hybrid semiconductor devices have been fabricated in the past and involve the fabrication of a single semiconductor device using two different types of semiconductor materials, such as, for example, group II-VI or group III-V semiconductor compounds secured to silicon. Such hybrid devices have generally been utilized in the field of focal plane array devices, though other uses therefore are readily apparent and contemplated. Hybrid focal plane array circuits in the past have generally been fabricated in a one at a time mode whereas economics indicate that fabrication in a batch mode is preferable.

In the case of the focal plane array circuit, the device is generally a combination of a compound semiconductor material, such as, for example, mercury cadmium telluride (MCT) and silicon. Capacitors are fabricated in the compound semiconductor material which detect photons of infrared on the surface thereof with a via extending from the capacitors to conductive areas on the integrated circuit (IC) contained in the silicon. The capacitor is read out by connection thereof to an amplifier and/or other appropriate circuitry in the IC.

There have been problems associated with the contemplated batch mode fabrication of hybrid focal plane array circuits.

Hybridization, mating or encapsulation of semiconductor materials according to the prior art often causes stresses in the semiconductor material resulting in electrical performance degradation. It is therefore desirable to smooth the semiconductor device active surfaces to eliminate sites of high point stresses thereon whereby the upper surface of the IC appears planar to the compound semiconductor when viewed from the compound semiconductor surface mating with the IC. Likewise, it is desirable to eliminate stress due to mismatch in coefficients of thermal expansion of the materials in contact with each other. These stresses can result in dislocations in the material. Stresses introduced from topology at mated surfaces can result in high dark currents in focal plan arrays, for example, and therefore provide reduced well capacity, thus degrading electrical performance.

The compound semiconductor is generally secured to the silicon by means of an epoxy and results in a thermal mismatch between, for example, the MCT, the silicon and the organic mating compound (e.g. the epoxy). Since focal plane arrays generally operate at 77° K., the temperature of liquid nitrogen, thermal mismatch becomes a serious problem. Because the various components have different temperature coefficients of expansion (TCE) and shrink at different rates during cooling, stresses are set up which degrade the electrical performance of the final hybrid device. It is therefore desirable that the stresses be distributed throughout the plane as uniformly as possible so that each pixel provides substantially the same output for a given light input.

To reduce dislocation defects in, for example, mercury cadmium telluride (MCT), the surface of the silicon integrated circuits (ICs) onto which the MCT will be mounted must be optically planar or better (i.e. <7000 Angstroms peak to valley and preferably about 1000 Angstroms or less peak to valley). In general, however, the upper layers of ICs are composed of metal, typically aluminum, capped in silicon dioxide. Unlike planarizing between metal layers in standard IC processing, the objective in the fabrication of hybrid devices is to make the finished IC surface as planar as possible, this degree of planarity being much more severe than has previously been required or available.

SUMMARY OF THE INVENTION

It is therefore a purpose of the present invention to provide a method of fabricating a hybrid semiconductor device and the device itself which overcomes the above noted problems of the prior art.

It is presently impossible to achieve a planar integrated circuit surface from layout optimization alone. There are inherent steps resulting from delineation and overlap of the thin films. To smooth and planarize these steps, techniques similar to those commonly used between metal layers in IC processing are implemented. The application of these processes is unique in that they are used on the top, final surface of the IC to reduce stress from subsequent encapsulation or hybridization.

To reduce hillocks (grains that protrude up from the metal film), the aluminum conductors can be doped with copper to suppress hillock growth. Unlike the typical reliability reasons to dope with copper, these being electromigration or overcoat integrity, the purpose herein is to reduce points that can result in large localized forces during mounting of the compound semiconductor element onto the IC. Also, in order to reduce hillocks that could result in high points of force during subsequent hybridization, the sintering step (anneal at 350° to 450° C.) is moved from before overcoat deposition to after overcoat deposition.

The design layout of the silicon IC (polysilicon, metal and moat features) influences the final topology of the surface, measured in terms of peak-to-valley (P-V) step height. Coincident edges and amount of overlap of the IC design are optimized to control the 3-dimensional stack up of resultant topology.

In accordance with the present invention, four separate process approaches can be used to planarize the IC surface. The planarization process approaches are the reverse metal pattern and etch, spin-on glass coating, polyimide coating and etch back and mechanical planarization. In practice, the reverse metal pattern and etch, spin-on glass and polyimide coating and etch back process are used in sequence in order to achieve the highest degree of planarity whereas the mechanical planarization approach is used independently.

The reverse metal pattern and etch planarization process is utilized upon completion of the metalization. A layer of oxide is deposited over the metal and patterned using a reverse image of the existing etched metal layer. This exposes the oxide over the metal for etch removal. In other words, "the tops of the mountains are removed" from the IC surface topography. Then a spin-on layer of photoresist is applied using the wafer spin technique. Because this is a spin-on process, the photoresist tends to be thicker in the "valleys" than on the "mountain tops". An overcoat etch tuned for equal etch rate between the oxide overcoat and photoresist is applied. This step again tends to reduce the height of the "peaks" and thus flattens the IC surface.

More specifically, a fabricated semiconductor substrate with circuitry therein having a metal conductor thereon has a layer of silicon oxide formed thereon followed by a layer of tensile silicon nitride and then a plasma deposited layer of silicon oxide. A layer of positive photoresist is then applied to the oxide layer. A reverse metal image is formed by transferring the image to the photoresist layer, such that the edges of the image are coincident or a slight undersize of the metal leads. The thickness of this photoresist layer can be adjusted empirically to compensate for stresses in the superstrate (compound semiconductor material) to be affixed to the substrate later in the process. The wafers then undergo a 120° C. hard bake and are then recoated with a layer of photoresist and rebaked. At this point, the field region is higher than the metal leads. Using a standard 1:1 oxide to resist etch-back process and end point detection, the first resist and part of the second resist are removed from the top of the metal leads with etching of a portion of the plasma oxide exposed as the photoresist layer is removed during the etch. The slices are then ashed to remove any remaining resist. The resulting surface of the IC is substantially planar.

To further planarize the IC surface, a spin-on-glass (SOG) is used to fill in the valleys remaining from the previous process sequence. This film results in a very thin coat on the peaks but tends to puddle and fill in the low lying areas. This is the only method available to fill the high frequency valleys that result from dense regions of IC geometry induced by the IC layout. This inorganic filler has a coefficient of thermal expansion (CTE) which matches the IC overcoat.

All of these actions result in a peak-to-valley (P-V) reduction from about 1.5 microns to less than 0.5 microns.

In accordance with another feature of the invention, the surface of the IC, after fabrication, must be planarized for application of focal plane array infrared detectors thereon. The problem and thus the resulting need for planarized substrates arises during a process point in the focal plane array fabrication flow in which a bar of mercury cadmium telluride (MCT) is physically attached to the IC surface. It is at this fabrication process point at which MCT is mounted to the IC surface using an epoxy as an adhesive and a mechanical press to press the MCT bar to the IC surface. The resulting damage to the MCT mount surface incurred during the mechanical press process is primarily due to the non-planar IC surface topology.

The IC topology is therefore further reduced to less than 0.1 microns by the application of a polyimide film, such as, for example, "Hitachi PIX 6400" using a spin coat process technique. The polyimide film is formed during a high temperature bake process (350° C.) after the polyamic acid resin is applied to the wafer. This film, like the spin-on glass and spin-on photoresist, also tends to fill in the "valleys" between the IC topography peaks. A subsequent blanket (unpatterned) reactive ion etch is then employed followed by a second application of the polyimide material.

The polyimide material chosen "Hitachi PIX 6400") for the first IC surface planarizing film has desirable physical properties such as viscosity and solids content that, in turn, strongly influences the planarization characteristics of the selected process application method. In addition, the polyimide film provides a resistant overcoat of the IC surface which protects the IC from process damage due to other processes utilized within the focal plane array fabrication process flow. The polyimide is easily removed when required by an oxygen plasma and the polyimide film is also compatible with the epoxy MCT mount process performed at a later step in the fabrication process flow. An oxygen/$C_2F_6$ reactive ion etch (RIE) process is used to "etch back" the polyimide film due to the etch uniformity and etch rate control characteristics. The second planarizing film material selected is preferably the same polyimide organic material used in the first planarization step. As a result of the second process step (RIE) and the use of the polyimide organic material in the first and third process steps, the process flow sequence is referred to as the polyimide etch back (PEB) process.

The PEB process comprises applying an initial polyimide coat to the IC surface to achieve some degree of improved surface planarity. A blanket reactive ion etch (RIE) process is used to uniformly etch the polyimide film back to the highest points on the IC surface. The etch rates of the polyimide film and IC surface oxide layer are similar in order to maintain the planarity that was present prior to the etch process due to the initial polyimide film coating. Similar etch rates between the IC oxide surface and polyimide film are necessary due to IC surface topography peak height nonuniformities. It is at this point in the process flow in which the IC surface planarity is similar to that of a single polyimide film coating. Also, the crevices between the high topography regions contain the polyimide organic. A second polyimide film is then applied to the IC/polyimide (first coat) surface. The second polyimide coat planarizes similar to a single polyimide coat but results in a highly planarized IC surface due to the planarity achieved previously during the first polyimide coat and maintained during the reactive ion etch of the first polyimide layer. The end result is that a high degree of planarity similar to multiple polyimide coats is achieved with a relatively thin planarizing polyimide film thickness.

The mechanical wafer planarization technique is an alternative approach used for IC planarization. This planarization technique is substantially different from the reverse metal pattern/SOG and polyimide coating planarization techniques described above in that the IC surface is "polished" planar. The desirable aspect of this IC planarization technique is that this process can virtually replace the reverse metal pattern/SOG and polyimide coating planarization processes.

The mechanical planarization process includes depositing a silicon oxide film on the wafer surface after the protective overcoat process has been completed. The minimum silicon oxide film thickness is determined by the peak to valley step height to be planarized. In practice, the thickness of the silicon oxide film is set at approximately twice the peak to valley step height (i.e., if the peak to valley step height is 1.5 microns, the oxide thickness is 3.0 microns) due to the polishing process being a timed rather than an end point detection process. The additional silicon oxide thickness allows for variation in the silicon oxide removal rate during the polish process and total silicon oxide removal nonuniformities across the wafer. Another reason for the selected deposited silicon oxide thickness is that since the polish process is timed, the polish process is stopped after desired peak to valley step height within the IC has been planarized but prior to completely removing all of the deposited silicon oxide and damaging the IC protective overcoat. The silicon oxide layer remaining on the IC surface also provides an additional protective layer that will prevent the IC from being damaged at later points within the FPA fabrication process. Upon completion of the silicon oxide film deposition, the wafer surface is then "polished" to remove a portion of the deposited silicon oxide until the desired peak to valley step height has been planarized. This is accomplished by using polishing equipment, pad and agents. The polish process is timed and the polish process time is established by determining the silicon oxide removal rate by processing silicon oxide coated silicon wafers containing no topography. The polish process step planarizes the IC surface by ablation of the silicon oxide coated peaks until the peaks have been reduced to the same plain as the valleys.

The next step in the FPA fabrication process involves mating the superstrate to the substrate surface. Although the substrate has been planarized by the techniques described above, the resulting substrate surface will tend to be smooth and rolling with differeing degrees of planarity. The highest and lowest degree of planarity is achieved within the high and low spatial frequency valley regions on the substrate, respectively. This is due to the design layout of the IC. To prevent the superstrate superstrate (compound semiconductor material, e.g., MCT) from being pressed against the IC surface during the superstrate mount, "stand off" pads (5 mils × 5 mils × 1.5 mils) are delineated and etched into another layer of polyimide. These polyimide pads accomplish the following: (a) they are formed on the periphery of the location at which the superstrate will be mounted, so the only contact made between the IC surface and the superstrate will be to the polyimide stand offs; (b) the epoxy bond line film thickness between the two materials is mechanically set by the height of the stand offs; (c) unlike the use of metal stand offs in printed wiring board fabrication, these stand offs are formed of a film which has a coefficient of thermal expansion (CTE) similar to the bonding material, in this case, epoxy, and (d) the stand offs allow a threefold reduction in mount pressure.

Prior to mounting of the superstrate, an epoxy is spun onto the substrate surface and the stand offs and has a thickness greater than the stand offs. The superstrate is then placed over the epoxy and moved against the stand offs under pressure, this movement being made possible due to the uncured condition of the epoxy. The epoxy is then cured as described below with superstrate thinning. The uniform epoxy bond line thickness between the superstrate and IC makes stress across the mounted superstrate uniform.

The superstrate is 27 to 30 mils thick when mounted with the epoxy to the silicon IC which is approximately 25 mils thick. Through experimentation comparing polycrystalline and single crystal group II-VI material, it has been determined that fully curing the epoxy while the superstrate is thick resulted in stress fractures and slip. The stress on the superstrate is affected by the sequence of epoxy cure conditions and superstrate thinning. The epoxy is cured in stages. "Soft cure" is a relatively low temperature bake step which begins cross-linking the epoxy but has not completed the reaction. The epoxy remains susceptible to chemical attack. The "hard cure" is at a temperature higher than soft cure. The epoxy fully cross-links, becoming resistant to chemical attack.

Fracturing and slip in the superstrate is minimized by changing the epoxy cure sequence and conditions. Thinning of the superstrate from 27 to 1 mil between the soft cure and hard cure, instead of after the cures, is the solution and is referred to herein as "modified epoxy cure". The epoxy is now resistant to chemical attack from acids, bases and solvents.

DESCRIPTION OF THE PREFERRED EMBODIMENTS

Figure 1A:
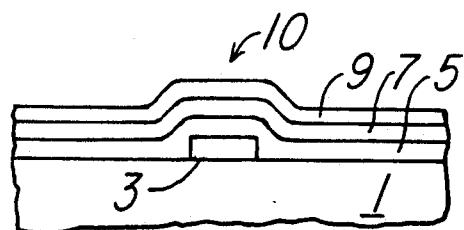
FIGS. 1a to 1f represent the process flow to provide planarization in accordance with the present invention.
Figure 1B:
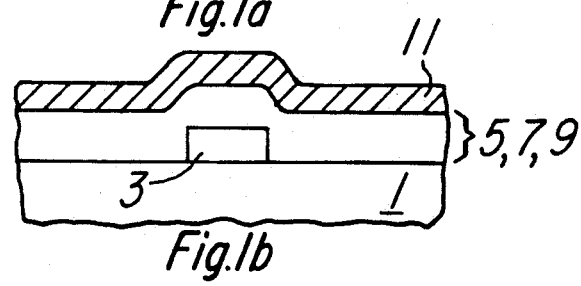

Referring first to FIGS. 1(a) through 1(f), there is shown in FIG. 1(a) a semiconductor substrate 1 having a metal conductor thereon having a height of 12K Angstroms. A 1000 Angstrom plasma deposited layer of silicon oxide 5 is formed over the substrate 1 and metal conductor 3 followed by a 3000 Angstrom layer of tensile silicon nitride 7 and then a 14,000 Angstrom plasma deposited layer of silicon oxide 9. It can be seen that a bump or non-planarity 10 appears over the conductor 3. A 15,000K Angstrom layer of positive photoresist 11 is then conformally deposited over the oxide layer 9 as shown in FIG. 1(b). It can be seen that the non-planarity is still present except for some rounding in the resist at formerly sharp edges.

Figure 1C:
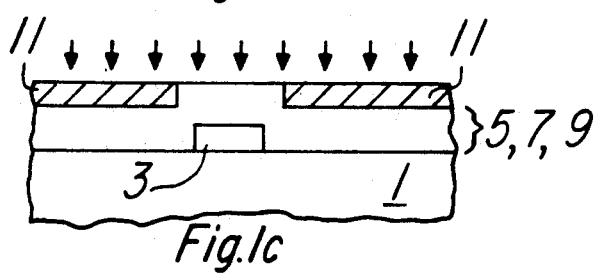
Figure 1D:
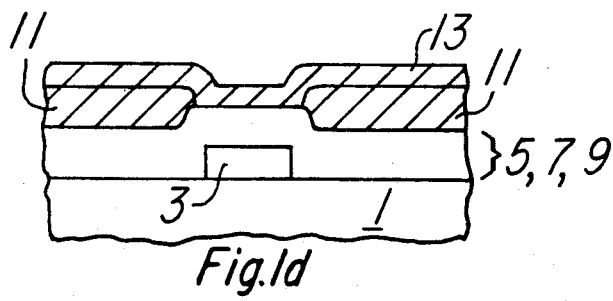
Figure 1E:
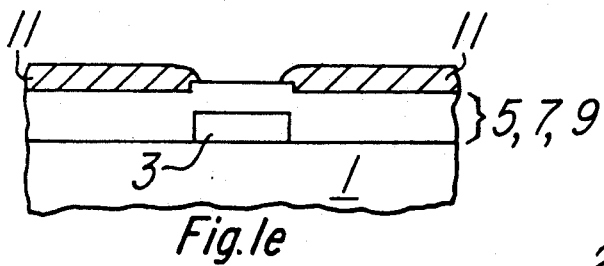
Figure 1F:
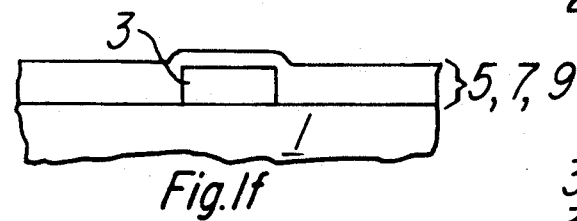

A reverse image of the metal mask pattern 11 is formed with the photoresist 11 using a micron size adjust, setting the exposure so that the edges of the pattern are coincident or slightly overlap the metal leads 3 as shown in FIG. 1(c). The IC wafers are then given a 120° C. hot plate hard bake for 1 to 5 minutes and then recoated with an 8K Angstrom layer of photoresist 13 and hot plate rebaked at 120° C. for 1 to 5 minutes. At this point, as shown in FIG. 1(d), the field region is higher than the metal leads by 3K Angstroms. Using a standard 1:1 oxide to photoresist etch-back process and end point detection, the photoresist 13 and part of the resist 11 are removed from the top of the metal leads 3 and followed by etching 8K Angstroms of the plasma oxide 9 as shown in FIG. 1(e). The slices are then ashed to remove any remaining resist as shown in FIG. 1(f). It can be seen that the surface of the IC is substantially planar as in the prior art, however, still further planarization is required herein for reasons as set forth hereinabove.

Figure 3A:
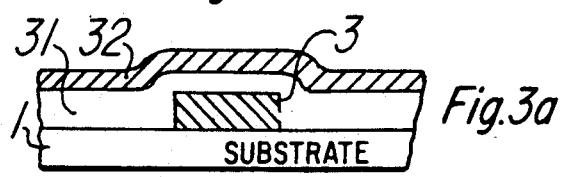
FIGS. 3a and 3b describe the polyimide planarization etchback procedure.
Figure 3B:
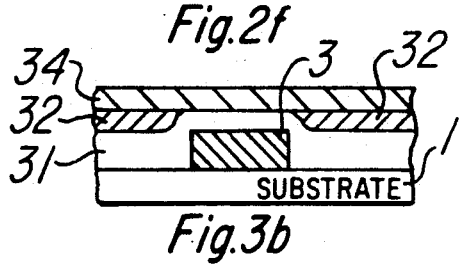

The IC surface of FIG. 1(f) is further planarized by using the polyimide etch back (PEB) process described hereinbelow. FIGS. 3A and 3B illustrate the PEB process sequence. The PEB process is initiated by prebaking the IC wafers which have been processed to the point as shown in FIG. 1(f) at 350° C. for 600 seconds followed by applying a layer of polyamic acid resin ("Hitachi PIX6400") 32 using a spin coat process technique over the oxide layer 9 which is numbered 31 in FIG. 3A. The wafers then receive a sequence of hot plate bake processes at various temperatures (90° C. bake followed by a 225° C. bake followed by a 350° C. bake) for 210 seconds at 90° C., 300 seconds at 225° C. and 900 seconds at 350° C. which causes the polyamic acid resin to undergo an imidization and cross-linking process, thus converting the polyamic acid resin into a cross-linked polyimide. Upon completion of the 350° C. hot plate bake process, the polyimide coated IC wafers are processed through a timed oxygen/$C_2F_6$ reactive ion etch (RIE) process to "etch back" the polyimide film to the oxide overcoat surface 31 on the IC. The etch rate of the polyimide was set equal to the oxide etch rate in order to maintain the IC planarization obtained from the first polyimide application 32. This was done in order to overcome IC topography problems that arise due to the IC design; i.e., the height of the "peaks" can vary across the IC surface. Thus, when the polyimide film coating over the tallest IC topography "peaks" is completely removed prior to the completion of the timed etch, the resulting exposed oxide layer will etch at the same rate as the polyimide which in turn maintains the peak-to-valley height that was present prior to the start of the RIE process. A second coating of polyimide ("Hitachi PIX 6400") 34 is then applied to the IC wafers upon completion of the polyimide RIE process. The second polyimide application process is similar to the first polyimide application process (i.e., prebake, spin coat and post coat bake process conditions) and provides further improved planarization of the IC surface.

Figure 4A:
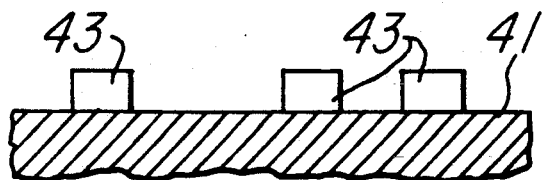
FIGS. 4a to 4f are a process flow in accordance with a further embodiment of the invention.
Figure 4B:
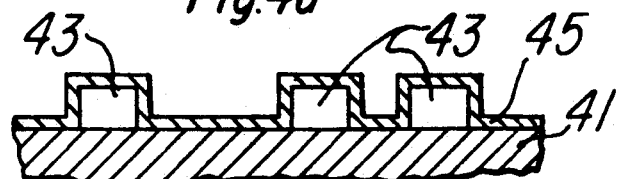
Figure 4C:
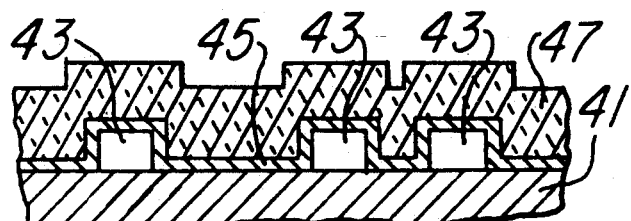
Figure 4D:
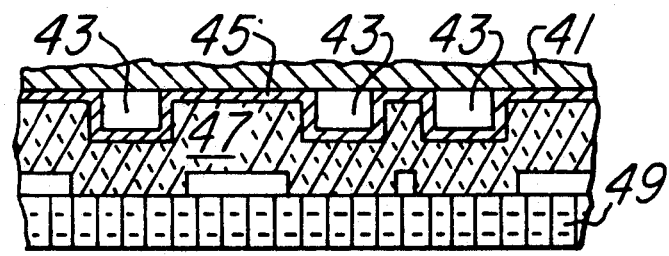
Figure 4E:
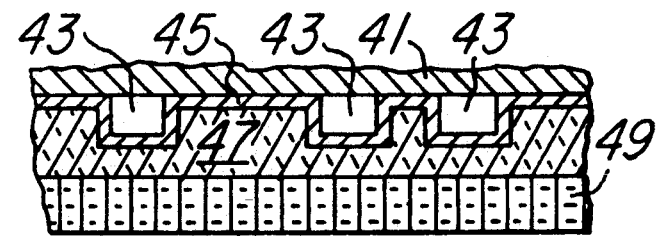
Figure 4F:
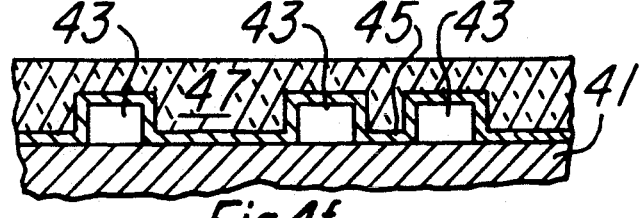

The mechanical planarization, when used as an alternative IC planarization process to that of the reverse metal pattern/SOG and polyimide planarization process, is described in FIGS. 4a to 4f. The process comprises obtaining a substrate 41 containing a predetermined topography 43, such as etched metal extending above a substrate as shown in FIG. 4a. A standard conformal film 45, preferably silicon nitride with a thickness of up to about 5000 Angstroms is then deposited over the topography 43 to form a protective layer on the surface of the substrate 41 to protect the IC from damage as shown in FIG. 4b. A film to be polished 47, preferably silicon oxide, is deposited onto the wafer surface to a thickness approximately twice the peak to valley dimension to be planarized as shown in FIG. 4c. The oxide film 47 on the substrate of FIG. 4c is then polished until the desired planarity is achieved by pressing the oxide layer against a polishing pad 49 which has been wetted with polishing slurry in standard manner as shown in FIG. 4d. The polishing uses standard wafer polishing equipment ("Westech Wafer Polisher Model 372"), standard polishing pads ("Rodel Suba IV, H-1") and standard polishing agent ("Cabott SC-1" diluted 1:1 with deionized water) for a time of approximately 3 to 15 minutes. The polish time is dependent upon the peak to valley dimension requiring planarization and the polish process silicon oxide removal rate. The polishing agent is continuously dispensed onto the polishing pad during the entire time in which the oxide layer 47 at the substrate surface is in contact with the polishing pad. The polishing agent interacts with the polishing pad to remove the deposited oxide in contact with the pad. Thus, the substrate surface is polished to planarity as shown in FIG. 4e. The polish process is stopped prior to removal of the deposited film over the peaks (topography regions 43), thus preventing damage of the conformal film 45 as a protective layer. The end result of the polish process is an extremely planar surface of the substrate as shown in FIG. 4f. The remaining deposited film not removed during the polishing process step is retained in place to assist the deposited conformal film as a protective layer of the substrate surface from further process damage that may occur during the fabrication of the FPAs.

Figure 2A:
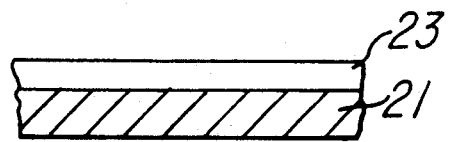
FIGS. 2a to 2f represent the process flow to provide standoffs in accordance with the present invention.
Figure 2B:
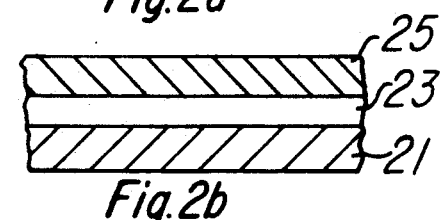

The formation of the polyimide "stand offs" follows the completion of PEB IC planarization process described with respect to FIGS. 3a and 3b. The polyimide "stand offs" are used in combination with the epoxy MCT mount process to set the epoxy bondline thickness between the two semiconductor materials. FIGS. 2A to 2E illustrate the polyimide stand off formation process. The polyimide stand off process is initiated by prebaking the PEB planarized IC wafer 21 with polyimide layer 23 thereon, layer 23 corresponding to the polyimide layer 34 of FIG. 3B and then applying a layer of polyamic acid resin 25 ("Hitachi PIX 6400") (FIG. 2B). The process is described using silicon test wafers and not ICs, i.e., the first polyimide layer 23 shown in FIG. 2A is assumed to be the IC polyimide planarizing layer for the polyimide stand off process development.

Figure 2C:
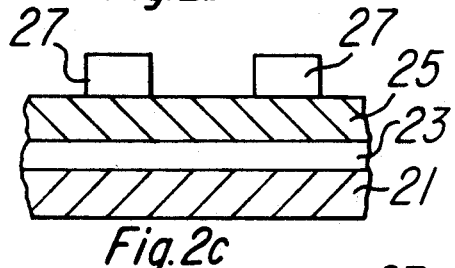
Figure 2D:
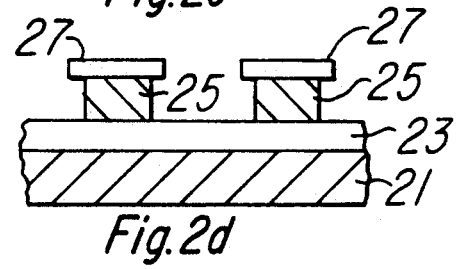
Figure 2E:
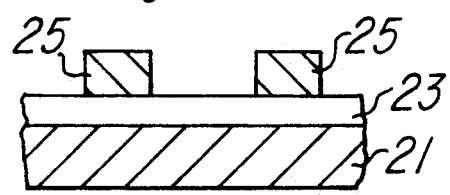

The IC wafers are then baked at 90° C. and 150° C., respectively for 210 seconds at 90° C. and for 300 seconds at 150° C., using a hot plate. At this point in the process, the polyamic acid resin has undergone limited imidization and virtually no cross-linking; thus, the second bake is designed to control the partially imidized polyamic acid resin solubility in various base solutions. The IC wafers are then imaged with the polyimide stand off geometric design 27 using a negative photoresist process and projection aligner (FIG. 2C). Negative photoresist was selected because it is insoluble in the polyamic acid etch solution. The IC wafers are then subjected to an oxygen ash to remove approximately 700 Angstroms of photoresist and baked at 120° C. for 3 minutes using a hot plate to increase the photoresist adhesion to the polyamic acid resin surface. The wafers are etched using a base solution (Hunt's Microstrip 2001) (FIG. 2D) to remove the partially imidized polyamic acid resin from the non-image regions of the IC and thus forming the polyimide stand offs 25 of FIG. 2D. The etch process is followed by a bake at 190° C. for 600 seconds on a hot plate. This bake process step is necessary to change the solubility of the partially imidized polyamic acid resin so that it is not soluble in the negative photoresist removal solution. The IC wafers are then subjected to a negative photoresist removal solution (Hunt's Nophenol) to remove the polyimide stand off negative photoresist layer 27 (FIG. 2D). The wafers are then baked at 225° C. for 300 seconds and then at 350° C. for 900 seconds using a hot plate to further imidize and cross-link the polyamic acid resin into a polyimide. This completes the IC preparation and the wafers are ready to be mounted with MCT as shown in FIG. 2E.

Figure 2F:
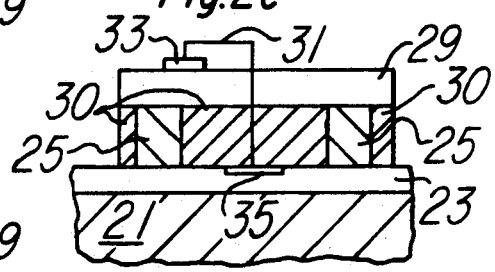

A MCT superstrate 29, which may have a thickness of about 30 to 40 mils, is then affixed to the standoffs 25 by means of an initially uncured epoxy 30. Initially, the epoxy 30 is spun onto the exposed surface in a standard photoresist dispense manner. The superstrate 29 is then applied to the uncured epoxy and pressed against the stand offs 25. The epoxy 30 thickness is set by partial curing while under pressure (about 1 to 15 psi). The epoxy is cured in stages. Initially the epoxy is heated to a temperature of 55° to 65° C. for a period of 30 to 40 minutes including ramp time to provide a partial curing or "soft cure" thereof. At this point the epoxy has not completed the cross-linking reaction and remains susceptible to chemical attack. This will allow the excess epoxy "fillet" to be removed with a suitable solvent. Solvents currently being used for this purpose include methanol and "NOPHENOL". After fillet removal, the epoxy is further cured, though still not completely, at 80° C. for 4 hours. This permits the epoxy to have sufficient resilience during processing of the superstrate to minimize stress fractures therein, but have sufficient adhesion to survive the thinning process Then the MCT wafer 29 is thinned to about 12 micrometers thickness in standard manner. The epoxy is then cured at a higher temperature to achieve resiliency and chemical resistance. The epoxy and polyimide are then ashed from the device in standard manner in the regions where there is no superstrate 29. Standard processing techniques are then applied to the superstrate 29 to form the capacitors of a focal plane array thereon including vias 37 and conductors 31. The conductors 31 interconnect pads 33 on plates of the capacitors on the superstrate 29 to pads 35 on the IC 21 through the via 37 to provide connection between the superstrate and substrate as shown in FIG. 2F.

Though the invention has been described with respect to specific preferred embodiments thereof, many variations and modifications will immediately become apparent to those skilled in the art. It is therefore the intention that the appended claims b interpreted as broadly as possible in view of the prior art to include all such variations and modification.

We claim:

1. A method of fabricating a hybrid semiconductor device comprising the steps of:
   (a) providing a semiconductor substrate having electrical devices therein;
   (b) providing a first resilient layer of electrically insulating material over said substrate disposed directly onto said substrate with a substantially planar exposed surface;
   (c) providing resilient standoffs, each standoff having a substantially planar first exposed surface, from a second resilient layer, said standoffs disposed at spaced locations on said substantially planar exposed surface of said first layer by forming said second layer over said first layer and then removing predetermined portions of said second layer;
   (d) providing a third resilient layer of electrically insulating material onto exposed portions of said first resilient layer disposed with a substantially planar second exposed surface coplanar with said first exposed surface, said third layer having a relatively resilient state and a rigid state;
   (e) providing a superstrate having thereon electrical devices;
   (f) securing said semiconductor superstrate against said second exposed surfaces by changing said third layer from said relatively resilient state to said rigid state; and
   (g) connecting said electrical devices on said superstrate to said electrical devices on said substrate.

2. The method of claim 1 wherein said semiconductor substrate is silicon.

3. The method of claim 1 wherein said first layer is a polyimide.

4. The method of claim 2 wherein said first layer is a polyimide.

5. The method of claim 1 wherein said second layer is a polyimide different from said first layer.

6. The method of claim 2 wherein said second layer is a polyimide different from said first layer.

7. The method of claim 3 wherein said second layer is a polyimide different from said first layer.

8. The method of claim 4 wherein said second layer is a polyimide different from said first layer.

9. The method of claim 1 wherein said superstrate is one of a group II-VI or group III-V compound or a group IV element.

10. The method of claim 2 wherein said superstrate is one of a group II-VI or group III-V compound or a group IV element.

11. The method of claim 3 wherein said superstrate is one of a group II-VI or group III-V compound or a group IV element.

12. The method of claim 4 wherein said superstrate is one of a group II-VI or group III-V compound or a group IV element.

13. The method of claim 5 wherein said superstrate is one of a group II-VI or group III-V compound or a group IV element.

14. The method of claim 6 wherein said superstrate is one of a group II-VI or group III-V compound or a group IV element.

15. The method of claim 7 wherein said superstrate is one of a group II-VI or group III-V compound or a group IV element.

16. The method of claim 8 wherein said superstrate is one of a group II-VI or group III-V compound or a group IV element.

17. The method of claim 16 wherein step (d) includes the steps of providing said second layer as polyamic acid having from about 1 to about 100 carbon atoms in the non-imidized polyamic acid resin precursor unit and then heating said second layer to a temperature of from about 90° C. to about 250° C. for from about 3 to about 15 minutes to cause partial imidization to complete imidization of said polyamic acid while causing said second layer to be resilient and wherein step (g) includes the step of heating said partially imidized to completely imidized polyamic acid to a temperature of from about 250° C. to about 400° C. for from about 10 to about 30 minutes to cause substantially complete cross-linking of said polyamic acid.

18. A method of fabricating a hybrid semiconductor device comprising the steps of:
   (a) providing a semiconductor substrate having electrical devices therein;
   (b) providing a first resilient layer of electrically insulating material over said substrate disposed directly onto said substrate with a substantially planar exposed surface;
   (c) providing resilient standoffs, each standoff having a substantially planar first exposed surface, from a second resilient layer, said standoffs disposed at spaced locations on said substantially planar exposed surface of said first layer by forming said second layer over said first layer and then removing predetermined portions of said second layer;
   (d) providing a third resilient layer of electrically insulating material directly onto exposed portions of said first resilient layer disposed with a substantially planar second exposed surface coplanar with said first exposed surface, said third layer having a relatively resilient state and a rigid state including the steps of providing said second layer as polyamic acid having from about 1 to about 100 carbon atoms in the non-imidized polyamic acid resin precursor unit and then heating said second layer to a temperature of from about 90° C. to about 250° C. for from about 3 to about 15 minutes to cause partial imidization to complete imidization of said polyamic acid while causing said second layer to be resilient;

(e) providing a superstrate having thereon electrical devices;

(f) securing said semiconductor superstrate against said exposed surfaces by changing said third layer from said relatively resilient state to said rigid state; and (g) connecting said electrical devices on said superstrate to said electrical devices on said substrate; including the step of heating said partially imidized polyamic acid to completely imidized polyamic acid at a temperature of from about 250° C. to about 400° C. for from about 10 to about 30 minutes to cause substantially complete cross-linking of said polyamic acid.

* * * * *